(12) United States Patent
Coleman

(10) Patent No.: US 7,229,891 B2
(45) Date of Patent: Jun. 12, 2007

(54) FABRICATION METHOD FOR SILICON-ON DEFECT LAYER IN FIELD-EFFECT AND BIPOLAR TRANSISTOR DEVICES

(76) Inventor: John Howard Coleman, P.O. Box 548, Locust Valley, NY (US) 11560

( * ) Notice: Subject to any disclaimer, the term of this patent is extended or adjusted under 35 U.S.C. 154(b) by 714 days.

(21) Appl. No.: 09/800,213

(22) Filed: Mar. 6, 2001

(65) Prior Publication Data

US 2006/0148155 A1    Jul. 6, 2006

(51) Int. Cl.
*H01L 21/322*    (2006.01)
(52) U.S. Cl. .................. 438/402; 438/473; 438/475; 257/E29.109
(58) Field of Classification Search ............... 438/143, 438/423, 471, 473, 475, 530, 798, 402; 257/E29.109
See application file for complete search history.

(56) References Cited

U.S. PATENT DOCUMENTS

| | | | |
|---|---|---|---|
| 5,034,343 A | 7/1991 | Rouse et al. | 437/86 |
| 5,198,371 A | 3/1993 | Li | 437/11 |
| 5,374,564 A | 12/1994 | Bruel | 437/24 |
| 5,461,245 A | 10/1995 | Gribnikov et al. | 257/197 |
| 5,633,174 A * | 5/1997 | Li | 438/475 |
| 6,144,072 A | 11/2000 | Iwamatsu et al. | 257/347 |
| 6,472,711 B1 * | 10/2002 | Shiota | 257/347 |

OTHER PUBLICATIONS

Jianming Li et al., Properties of Silicon-on-Defect-Layer Material, in: Materials Research Society Symposium Proceedings vol. 396, David B. Poker et al., Ed., pp. 745-750.

Jianming Li, New annealing processes and explanation for novel silicon pn junctions formed by proton implantation, Electronics Letters, vol. 35 (1997), pp. 133-134.

Jianming Li et al., Properties of proton-implanted p-type Si: supports for the model explaining a novel p-n junction in Si, Nuclear Instruments and Methods in Physics Research B 160 (2000), pp. 190-193.

J. S. Williams et al., The role of oxygen on the stability of gettering of metals to cavities in silicon, Applied Physics Letters, vol. 75, No. 16, Oct. 18, 1999, pp. 2424-2426.

K. Henttinen et al., Mechanically induced Si layer transfer in hydrogen-implanted Si wafers, Applied Physics Letters, vol. 76, No. 17, Apr. 24, 2000, pp. 2370-2372.

J. Grisolia et al., A transmission electron microscopy quantitative study of the growth kinetics of H platelets in Si, Applied Physics Letters, vol. 76, No. 7, Feb. 14, 2000, pp. 852-854.

(Continued)

*Primary Examiner*—Minh-Loan Tran
(74) *Attorney, Agent, or Firm*—Peter A. Businger

(57) ABSTRACT

Semiconductor devices have device regions in which semiconductor properties such as spreading resistivity and its profile are significant. In making a p-type device region on a semiconductor wafer, an initial semiconductor device region is defined by a buried region, and an initial spreading resistivity profile is developed by annealing. After annealing, semiconductor device properties can be enhanced by removing a surface sub-region of the initial device region, and can be further improved by epitaxially growing thereon a monocrystalline film as an improved channel layer for FET devices. Such properties are relevant in MOS as well as bipolar devices.

13 Claims, 3 Drawing Sheets

OTHER PUBLICATIONS

Jianming Li, The new exploration for proton-implanted silicon: the conversion of a surface-region-purification-induced p-n junction into a p-i-n electrical structure approaching silicon on insulator, Semiconductor Sci. Technol. 15 (2000), pp. L6-L9.

J. H. Evans et al., The Annealing of Helium-induced Cavities in Silicon and the Inhibiting Role of Oxygen, Nuclear Instruments and Methods in Physics Research B28 (1987), pp. 360-363.

M. J. Goeckner et al., Plasma doping for shallow junctions, J. Vac. Sci. Technol. B 17 (5), Sep./Oct. 1999, pp. 2290-2293.

Dixon Tat-Kun Kwok et al., Particle-in-cell and Monte Carlo simulation of the hydrogen plasma immersion ion implantation process, Journal of Applied Physics, vol. 86, No. 4, Aug. 15, 1999, pp. 1817-1821.

* cited by examiner

FABRICATION METHOD FOR SILICON-ON DEFECT LAYER IN FIELD-EFFECT AND BIPOLAR TRANSISTOR DEVICES

TECHNICAL FIELD

The present invention relates to semiconductor devices and, more particularly, to VLSI/ULSI fabrication of MOSFET and bipolar transistors.

BACKGROUND OF THE INVENTION

The need for scaling metal-oxide-semiconductor (MOS) devices down to below 0.1 µm feature size in very-large-scale integrated (VLSI) circuits has been clearly indicated in the *National Technology Road Map for Semiconductor Technology* (1997 Edition), Semiconductor Industry Association, San Jose, Calif. For such circuits, silicon-on-insulator (SOI) MOS devices appear to be promising as described in *SOI Technology: Materials to VLSI* ($2^{nd}$ edition), Boston, Kluwer, 1997. Such materials are disadvantaged, however, in having a large dose of oxygen ions implanted through the top surface layer of a silicon wafer on which devices are fabricated.

An alternative method for fabricating SOI materials is disclosed in U.S. Pat. No. 5,374,564, issued Dec. 20, 1994 to Bruel and incorporated herein in its entirety. Instead of using ion implantation, an oxide layer is formed by oxidation of the top surface of a silicon wafer, protons are implanted through the oxidized surface, the implanted wafer is annealed to form a hydrogen micro-bubble layer beneath a thin surface layer, a stiffener silicon wafer is attached to the oxidized surface of the annealed wafer, and the resulting structure is heated to expand the micro-bubbles, thereby lifting off the top surface layer which remains attached to the stiffener wafer, forming an SOI wafer. It has been reported further, by K. Henttinen et al., "Mechanically induced Si layer transfer in hydrogen-implanted Si wafers", *Applied Physics Letters*, Vol. 76, No. 17, 24 April 2000, that, after proton implantation beneath a top surface layer of a silicon wafer and annealing to form hydrogen bubbles, the surface layer can be mechanically lifted off by a stiffener wafer at relatively low temperatures.

Incorporated herein in their entirety are U.S. Pat. Nos. 5,198,371 and 5,633,174, issued to Li on Mar. 30, 1993 and May 27, 1997, respectively, disclosing a high-resistivity hydrogen bubble layer or defect layer under a thin surface layer of a silicon wafer after hydrogen implantation and annealing at high temperature. Termed "silicon-on-defect layer", the surface layer was found to have improved semiconductor properties such as electron mobility. The structure of the hydrogen bubble or platelet layer is described by J. Grisolia et al., A transmission electron microscopy quantitative study of the growth kinetics of H platelets in Si", *Applied Physics Letters*, Vol. 76, No. 7, 14 Feb. 2000.

Li, Jones, Coleman, Yi, Wallace and Anderson, "Properties of Silicon-on-Defect-Layer Material", pp. 745-750 in *Materials Research Society Proceedings*, Vol. 396, David B Poker et al., Ed., Materials Research Society (MRS), Pittsburgh, Pa., 1996 report on high-temperature annealing after proton implantation resulting in conversion of a top surface layer on a high-resistivity layer from n-type to p-type, thereby forming a p-n junction at the high-resistivity layer. Furthermore, the p-type spreading resistivity was found to decrease steadily from the high-resistivity buried layer to a low resistivity at the surface of the wafer, lower than original wafer resistivity, and the n-type spreading resistivity to decrease steadily to its original value beneath the defect layer, as illustrated there at p. 747 in FIG. 1. The conversion from n-type to p-type by proton implantation in the top surface layer has been confirmed by data of Li, "New annealing processes and explanation for novel pn junctions formed by proton implantation", *Electronics Letters*, Vol. 35, p. 133, 1997. Furthermore, as reported by Li in *Nuclear Instruments and Methods in Physics Research B*, Vol. 160, p. 190-193, Elsevier, 2000, when a p-type silicon wafer was implanted with protons and annealed, a high-resistivity bubble layer was formed beneath the surface, without affecting the type of the overlying surface layer.

Over prior SOI and silicon-on-defect-layer (SODL) device structures, the invention described below results in advantages which are particularly significant in ultra-large-scale integration (ULSI).

SUMMARY OF THE INVENTION

In making a p-type device region on a semiconductor wafer, an initial semiconductor device region is defined by a buried region, and an initial spreading resistivity profile is developed by annealing. I have discovered that, after annealing, semiconductor device properties can be enhanced by removing a surface sub-region of the initial device region, and can be further improved by epitaxially growing thereon a monocrystalline film as an improved channel layer for FET devices. Such properties are relevant in MOS as well as bipolar devices.

BRIEF DESCRIPTION OF THE DRAWING

The Figures illustrate preferred embodiments of the invention, as to processing as well as to resulting semiconductor structures and devices.

DETAILED DESCRIPTION

An n-type silicon wafer having an original bulk spreading resistivity of about 40 ohm-cm is implanted with 180 keV protons to a dose of about $3 \times 10^{16}$ protons/cm$^2$ and annealed in a nitrogen-hydrogen atmosphere at 900 degrees C for 10 seconds to develop a buried hydrogen bubble or platelet layer, as further described in the Li patents. The implanted wafer is annealed by heating to 1180 degrees C for 20 minutes for conversion of the top surface layer from n-type to p-type conductivity as further described in the 1996 MRS article. The surface of the annealed wafer is subjected to plasma etching to reduce the thickness of the top surface layer overlying the buried layer to approximately 0.1 μm. Other suitable means for thickness reduction include chemical etching and chemical-mechanical polishing (CMP).

Figure 1:
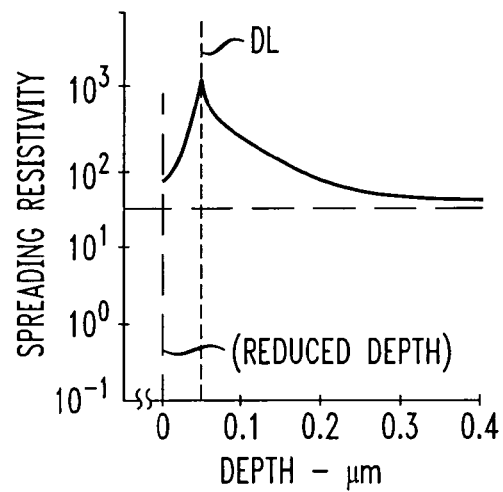
FIG. 1 is a graphic representation of spreading resistivity as a function of depth for a p-n junction.

For the resulting structure, FIG. 1 shows spreading resistivity versus depth as measured from the surface of the reduced-thickness surface layer. As compared with the spreading resistivity graph in the 1996 MRS article, it is apparent that etching has resulted in removal of a low-resistivity portion of the top surface layer. Further in contrast, the gradient of spreading resistance versus thickness is significantly greater in the present new structure.

While exemplary processing as described herein-above involved two separate steps of annealing, benefits of the invention can be realized also with a single annealing step, e.g. at 900 degrees C. for 4 hours, and other suitable temperature-time profiles are not precluded. Benefits include control of the spreading resistivity profile on an active layer, in MOSFET as well as bi-polar devices.

Figure 2:
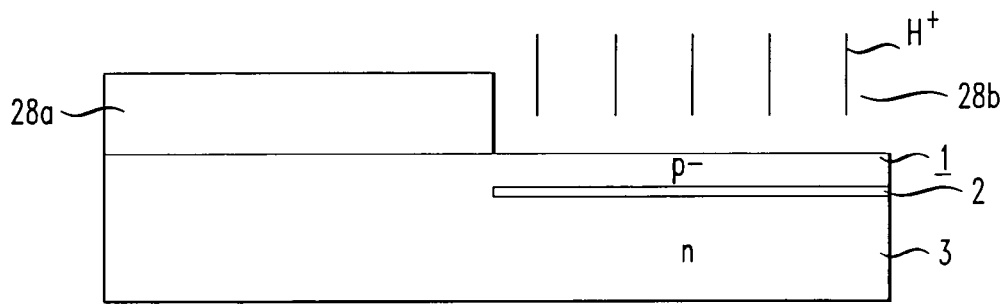
FIG. 2 is a schematic of protons being selectively implanted into an unmasked surface portion of an n-type silicon wafer.
Figure 3:
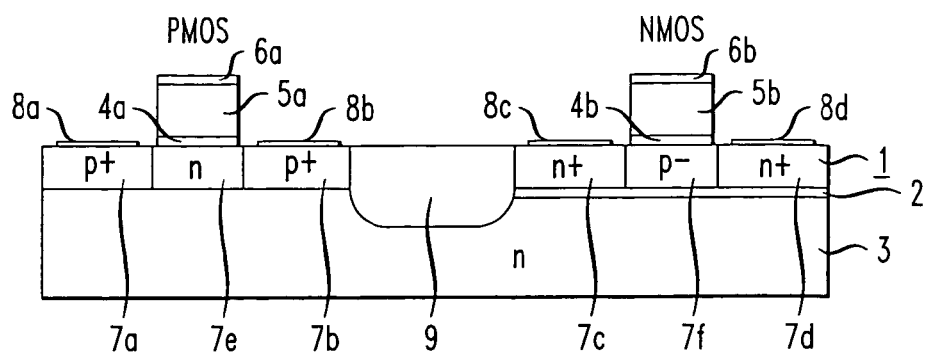
FIG. 3 is a schematic cross section of a complementary metal-oxide-silicon field effect transistor (CMOSFET) structure.

FIGS. 2 and 3 schematically illustrate phases in the fabrication of a CMOSFET in an n-type silicon wafer 3. FIG. 2 shows protons being selectively implanted into an unmasked surface portion 28b of an n-type silicon wafer 3 to form a buried high-resistivity defect layer 2 delimiting a top surface layer 1 to be converted to p-type. Other than protons, suitable particles for implanting further include neutrons, molecular hydrogen ions, inert-gas ions such as helium, xenon or argon ions and metallic ions, as well as combinations thereof, here as well as in the other embodiments of the invention. FIG. 3 shows a CMOSFET in which an n-type MOSFET is fabricated in a converted p-channel of an n-type silicon wafer by selective proton implantation, and in which a p-channel MOSFET is fabricated in the non-irradiated portion of the n-type silicon wafer.

As shown in FIG. 2, for the n-type portion (NMOS) of the device, a thick mask 28a with openings 28b is formed on the wafer. Among suitable mask materials are oxides and photo-resists, and the openings 28b can be formed by pattern etching, for example, selectively exposing areas of the silicon wafer surface for proton implantation while other areas remain shielded by the mask layer 28a. After forming the defect layer 2 by proton implantation, the mask 28a is removed e.g. by etching, and the wafer is annealed to convert the top surface layer 1 to p-type as described herein-above. Next, a top portion of the top surface layer 1 is removed by etching, for example, in order to attain a profile of spreading resistivity versus depth suitable for an FET or bipolar device, e.g. as shown in FIG. 1. The surface of the complementary, non-implanted PMOS region can be oxidized and etched simultaneously with the NMOS region by conventional oxidation etching and polishing techniques for reducing thickness and remove particulates and impurities so as to obtain a desired spreading resistivity profile, though without the additional benefit in regions with a buried layer.

The CMOSFET device shown in FIG. 3 has a p-type surface layer 1 on defect layer 2 in wafer 3 which is processed as described in connection with FIGS. 1 and 2, for example, at which point the top surface layer 1 has a desired spreading resistivity profile. In further exemplary processing, conventional photo-resist masking, etching and oxidation steps are used to fabricate the gate dielectric layers 4a and 4b and dielectric trench 9 for dielectric isolation of the PMOS and NMOS regions. The gate dielectrics 4a and 4b may be 100 angstroms thick or less, in accordance with established design rules to form ULSI devices. Doped polysilicon gate electrodes 5a and 5b which are covered by thin metallic or metal silicide films 6a and 6b are deposited on the gate dielectrics 4a and 4b using conventional photo-toresist masking, etching and deposition techniques. Next, the p+ doped regions 7a and 7b and n+ doped regions 7c and 7d are formed in the surface layer 1, e.g. by ion implantation, thereby leaving channels 7e and 7f as the active layers in the top surface layer 1 to form the PMOS and NMOS devices, respectively.

Advantageously, the doped p+ source and drain regions 7a-7d can be fabricated by implanting dopants such as boron and phosphorus, utilizing plasma doping as described by M. J. Goeckner et al., "Plasma doping for shallow junctions", Journal of Vacuum Science and Technology B, Vol. 17, No. 5, Sep/Oct 1999, pp. 2290-2293. The resulting shallow regions are particularly suited for use with the profiled surface layer as described in connection with FIG. 1 here-inabove. In addition, as described by Goeckner et al., plasma source ion implantation (PSII) can be used to implant the protons to form defect layer 2 or the doped layers in accordance with the invention.

In operation, the CMOS device, and in particular the NMOS portions, has improved performance compared to conventional CMOS devices. Moreover, the high-resistivity p-layer has significantly improved cut-off and transconductivity characteristics. Although the exact theory is not known, the SR profile appears to provide a conductivity channel through which both lateral and vertical electric fields can substantially penetrate and control charge carriers. Substantial depletion of the charge carriers is obtained, thereby improving the threshold voltage and sub-threshold slope of the source-drain current. Best results are obtained by etching back the initial top surface layer until the spreading resistivity is equal to or greater than the original resistivity of the wafer.

FIGS. 5-8 schematically illustrate a further processing embodiment of the invention, of a CMOSFET having a p-type, top surface layer 11 on a defect layer 12 in an n-type silicon wafer 13.

Figure 5:
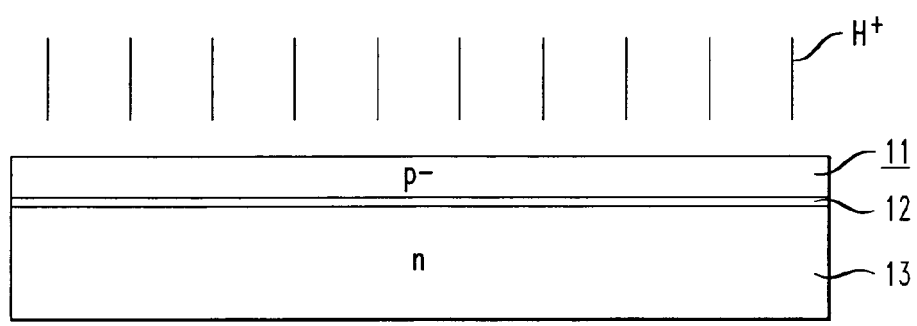
FIGS. 5-8 are schematic cross sections of sequentially evolving structure in exemplary fabrication of a CMOSFET.

FIG. 5 shows protons being implanted through a top surface layer 11 of an n-type wafer 13. With a first annealing step, e.g. at 900 degrees C. for 10 seconds, a defect layer of platelets or bubbles is formed at or near the end of the proton range, e.g of 1.2 to 2 μm when proton energy is 180 keV and the dose is $2 \times 10^{16}$ protons/cm$^2$ as described in the 1996 MRS article, for example. Lower proton energies, e.g. down to 100 keV or less can be used to make thinner top surface layers 11. A second annealing step, e.g. at 1180 degrees C. for 20 minutes is next applied to implanted wafer 13 in order to develop the high resistivity defect layer 12, to remove impurities from top surface layer 11 and to convert layer 11 to p-type silicon. Top surface layer 11 is then etched and polished to reduce the thickness above defect layer 12, as described in connection with FIGS. 1 and 2, so as to fabricate an active channel for charge carriers that confines the charge carriers to a thin top surface under charge accumulation and depletion conditions and through which the gate electric field can penetrate.

Figure 6:
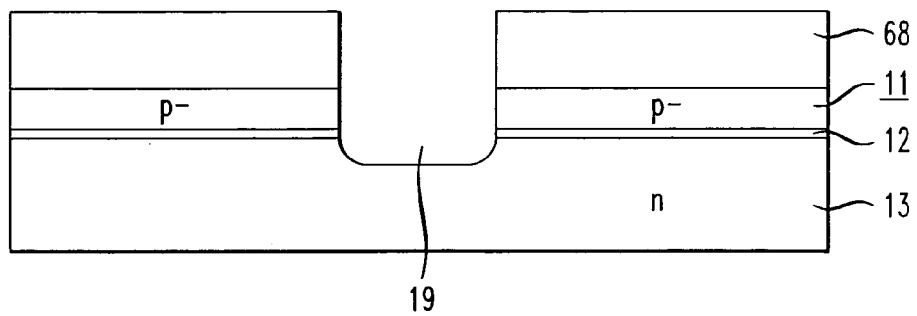

Referring to FIG. 6, a photomask is applied to top surface layer 11 and patterned and etched by conventional photolithography techniques so that deep trench 19 can be etched through top surface layer 11 and defect layer 12 into the bulk of wafer 13 to electrically isolate the PMOS and NMOS regions.

Figure 7:
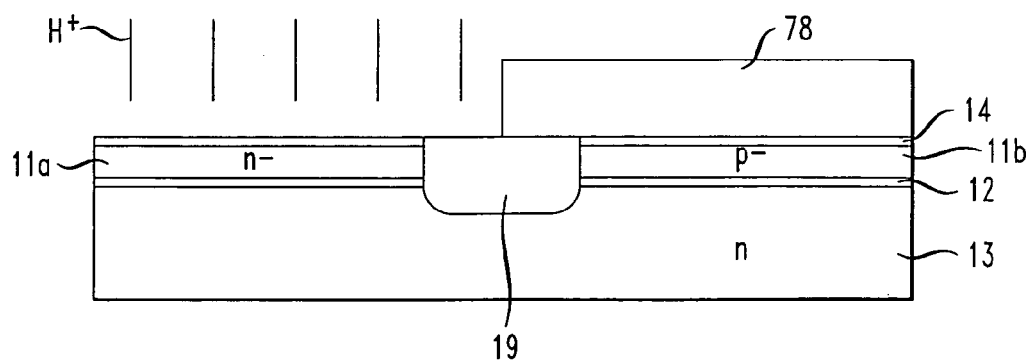

Referring to FIG. 7, after etching away photomask 18a and oxidizing the top surface layer 11 in order to form the silicon oxide gate dielectric layer 14 (about 100 angstroms thick), photomask 18b is applied with open regions over the PMOS regions. Phosphorus or arsenic ions are selectively implanted through gate dielectric layer 14 to convert the p-type top surface layer back to n-type silicon suitable for the active channel of the PMOS regions.

Figure 8:
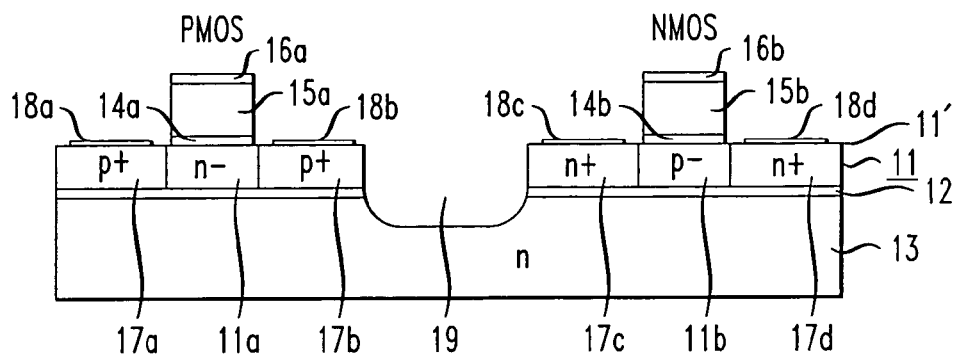

FIG. 8 shows a cross-sectional view of a CMOSFET, e.g. fabricated using the wafer 13 processed by techniques described in connection with FIGS. 4-7. The n-type wafer 11 comprises surface layer 11a doped to n-conductivity, and another portion 11b converted to p-conductivity, with the two portions being separated and insulated by trench 19 which preferably penetrates through defect layer 12. Conventional photolithography, etching and deposition techniques are then used to fabricate the PMOS and NMOS devices as ULSI circuits in defect layer 12. The finished device includes PMOS and NMOS regions having gate dielectric films 14a and b (e.g. 100 angstroms thick) on channels 11a and 11b to which doped polysilicon electrodes 14a and 14b with thin film electrodes 16a and 16b are applied respectively. Conventional photolithography techniques are used to etch the appropriate pattern.

The PMOS and NMOS regions further include p+ and n+ doped source and drain regions 17a and 17b and 17c and 17d respectively, having metallic electrodes 18a-18d fabricated in surface layer 11. As described in connection with FIG. 3, shallow doping, e.g by plasma doping (PLAD) or plasma immersion ion implantation (PIII) of source and drain contacts 17a-17d is preferred.

In operation, the present CMOSFET device has improved transconductance and lower latch-up than conventional CMOSFET. Putatively, the improvement may be related to the combination of high-resistivity defect layer 12, which extends under all the devices, and trench 19, which electrically isolate adjacent PMOS and NMOS devices. In addition, as noted in the 1996 MRS article, improved transconductance may be attributed to the gettering action of defect layer 12 and by the etch-back step for reducing the thickness of the top surface layer. Furthermore, the spreading resistivity profile that resulted from the implantation, annealing and etch-back procedures functioned to confine the conduction of charge carriers to a thin layer 11' of the top surface layer 11 into which both normal and lateral electric fields could penetrate, thereby improving cut-off and other properties of the FET. In addition, using wafers with minimum oxygen content enables the defect layer 11 to getter metals and other impurities otherwise present in the top surface layer.

Figure 9:
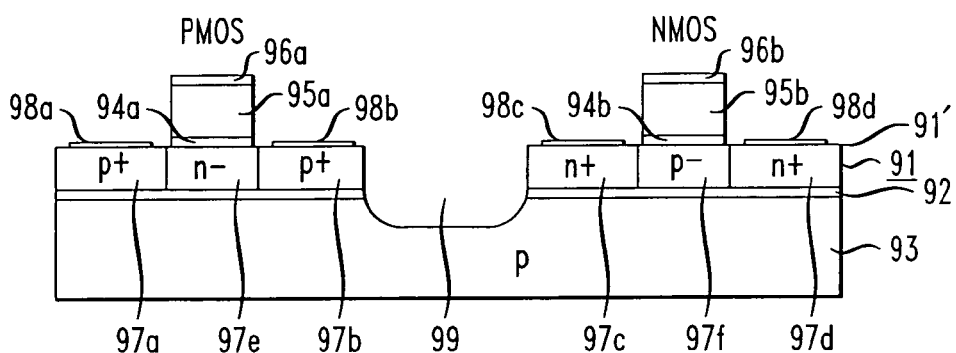
FIG. 9 is a schematic cross section of an alternative CMOSFET structure.

FIG. 9 shows schematically a view of CMOSFET fabricated on a top surface layer 91 on a defect layer 92 in a p-type Si wafer 93. The hydrogen implantation procedures are similar to those described in connection with FIG. 8 except that, as the top surface layer 91 is already p-type, implantation changes the spreading resistivity but does not change the conductivity type as described by the Li (2000) article. But, n-type dopant, such as phosphorous or arsenic is implanted into channel portion 97e under gate dielectric 94a of the PMOS portion. In addition, more concentrated p+ and n+ dopants are implanted into source and drain regions 97a and 97b, and 97c and 97d of the PMOS and NMOS devices, respectively. Metallic contacts 98a-98d are applied to source and drain doped regions 97a-97d, and polysilicon electrodes 95a and 95b with metallic contacts 96a and 96b are fabricated on gate dielectrics 94a and 94b of the PMOS and NMOS regions respectively. Deep trench 99, which penetrated defect layer 92 between the PMOS and NMOS regions, provided electrical isolation and insulation. Again, conventional photolithographic, etching and deposition with appropriate design rules are utilized.

The top surface layer 91 is fabricated by controlling the annealing steps and etch back steps, such as described in connection with FIG. 1, so as to produce a spreading resistivity profile which functioned to confine the charge carriers to the top surface channel 91' of top surface layer 91. In addition, electric fields penetrated through top layer 91', thereby improving transconductance characteristics substantially compared to conventional CMOS devices. Again, metals and other impurities are gettered by defect layer 92 and surface contaminants are removed by etch back deeper than usual wafer processing to provide the desired SR profile.

Figure 4:
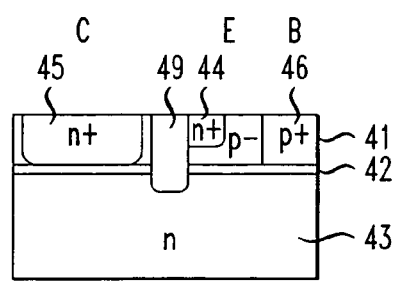
FIG. 4 is a schematic cross section of an n-p-n bipolar transistor structure.

FIG. 4 shows a n-p-n bipolar transistor in which the emitter/base regions 44/46 are fabricated in a p-well top surface layer 41 on defect layer 42 by selective proton implantation in a n-Si wafer 43. The p-well 41 is formed by annealing and etching to form the desired profile such as, for example, described in connection with FIG. 1. Contacts (n- and p-type) are implanted in the p-layer using As or P and B sources respectively as shown. The n+ collector C region 45 is formed by diffusing or implanting As or P into the top surface layer 41 of the n-Si wafer 43 to defect layer 42 after the etching and polishing process.

In any of the embodiments discussed above, the top surface layer on the defect layers which comprise microbubbles or platelets after the first annealing step, may be removed from the Si wafer by attaching the top surface layer to an oxidized (stiffener) Si wafer and by heating in order to raise the pressure of the microbubbles sufficiently to exfoliate the top surface layer as described by the Bruel '564 patent. Alternatively and in contrast, the top surface layer can be mechanically sheared off as described by Henttinen et al.

However, the top surface layer is converted to p-type conductivity with a high spreading resistance profile, thereby producing a SOI p-channel with high-resistivity and a predesigned gradient. The stiffener wafer may be n- or p-type. In addition, a gate electrode may be applied to the top oxide layer which subsequently becomes a buried SOI layer before the lift-off or exfoliation step. After the lift-off step, the boundary of the buried layer becomes the new top surface of the top surface layer. This surface may be polished or etched to remove the boundaries of the bubbles or platelets and to adjust the total thickness of the new p-type high-resistivity layer.

Figure 10:
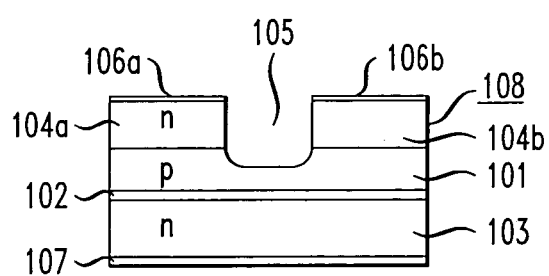
FIG. 10 is a schematic cross section of a bipolar transistor structure.

In yet another embodiment of the invention, FIG. 10 shows schematically a crossectional drawing of a bipolar transistor with a p-type floating base 101 fabricated on defect layer 102 in n-type wafer 103 after proton implantation through the layer 101, and after annealing as described above in connection with FIG. 1. After etch back to obtain the desired spreading resistivity profile, emitter layer 108 is grown epitaxially on the top of base 101 by CVD or other standard procedures. The wafer 103 with metallic contact 107 functions as the collector in electrical contact with defect layer 102 of base 101. Layer 108 is doped to n+ conductivity, e.g. by implanting P or As dopants or incorporating gaseous dopants such as phosphine or di-borine during epitaxial growth, and is physically separated into two emitter regions 104a and 104b by deep trench 105 which penetrates layer 108 and preferably into p-layer 101 so as to electrically isolate the two emitter regions 104a and 104b. Contacts 106a and 104b are applied to emitter regions 104a and 104b.

Conventional fabrication techniques, operating conditions and applications, such as described in U.S. Pat. No. 5,461, 245, issued Oct. 24, 1995 to Gribnikov et al. which is incorporated herein in its entirety, may be used along with the novel process procedures disclosed herein.

In operation, the mobility of the charge carriers in the base is significantly increased compared with those in conventional bipolar and floating devices. Furthermore, when used in applications, such as logic circuits as described in the Gribnikov '245 patent, substantially improved operating characteristics are found. High mobility floating base layer 101 and its defect layer 102 in contact with collector layer 103 provided unique p-n junction characteristics not heretofore available.

In addition, the improved composite epi-layer 108 on annealed and etched layer 101 on defect layer 102 provides improved performance for other semiconductor devices such as, for example, described above in FIGS. 2-9. Thus such a composite is described next in connection with FIG. 11.

Figure 11:
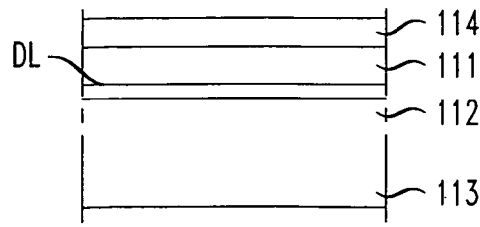
FIG. 11 is a schematic cross section of a semiconductor composite structure.

FIG. 11 shows a substrate wafer 113 with epitaxial layer 114 deposited on layer 111 on defect layer 112 in wafer 113. Ions comprising hydrogen ions are implanted through the initial top surface of layer 111 so as to create defect layer 112 after annealing such as described in connection with FIG. 1. As described above, after annealing the thickness of layer 111 is reduced by etching and polishing to obtain the desired spreading resistivity profile. But, in the present embodiment the resistivity profile is adjusted to function in combination with the top epitaxial layer 114 so as to form a channel for charge carriers when, for example, ULSIFET devices are fabricated in layer 114, which, for example, may have a thickness of 10 nm or less using appropriate design rules. Such a composite, for example, may be used for FET devices such as shown by FIGS. 2-9 with the combination of epi-layer 114 on reduced thickness layer 111 being substituted for layers 1, 11, and 91.

The epitaxial layer is on the annealed and etched p-layer with the desired surface of the p-layer, after irradiating, being annealed and etched so as to produce the desired spreading resistivity. Combinations of such conductivity types include n-epi on p/peak/p or on p/peak/n, and p-epi on p/peak/p or on p/peak/n, where "peak" means the high resistivity peak which is produced by the initial defect layer. In operation, although it is necessary to create the defect layer by ion implantation in order to getter impurities and increase the resistivity above the original resistivity of the wafer substrate, it is not necessary for a detectable defect layer to be present after annealing provided impurities are anchored at microscopic platelets or even a microscopic layer of dislocations. The crystal structure of the device region after irradiating, annealing and etching, in which devices are fabricated is improved when compared to the wafer substrate because impurities are lower in the initial surface region. Consequently the epitaxial layer, which faithfully follows its substrate structure, also has an improved crystal structure and lower impurities than available by other processes.

In operation, devices fabricated using the structure shown in FIG. 11 have significantly improved electrical properties, possibly because defect layer 112 remains active in gettering impurities, thereby producing an improved crystal structure and mobility in layers 111 and 114. Such properties have never before been realized because epi-layers conventionally deposited on conventional wafers did not have the benefit of such gettering and crystal structure. Lower-cost original wafers, having higher impurity levels, can be utilized. Furthermore, when the composite structure shown in FIG. 11 is used for fabricating FET devices, the conductivity of the epitaxial layer 114 and the spreading-resistivity of p-layer 111 can be cooperatively adjusted so that charge carriers are channeled through epi-layer 114 and, in addition, latch-up between adjacent NFET and PFET devices are minimized. Such a composite layer has unique transconductance characteristics and overall device performance not available by other means.

I claim:

1. A method for making a semiconductor device having a p-type device region, comprising the steps of:
    (i) forming an initial region to an initial depth from at least a portion of an initial surface of a semiconductor substrate which has a conductivity type and an original bulk spreading resistivity,
    (ii) heating said initial region, therein to develop an initial spreading resistivity profile having a peak, with peak value greater than said bulk spreading resistivity,
    (iii) removing material from said initial surface portion, thereby forming said p-type device region having a new surface from which said resistivity peak is at a reduced depth, whereby said p-type device region has a final resistivity profile having a gradient which is significantly greater than gradient of said initial spreading resistivity profile.

2. The method of claim 1, wherein step (i) comprises implanting particles.

3. The method of claim 2, wherein said particles are selected from the group consisting of neutrons, protons, hydrogen ions, inert-gas ions and metallic ions.

4. The method of claim 1, wherein said substrate has p-type conductivity.

5. The method of claim 1, wherein said substrate has n-type conductivity and wherein, in step (ii), heating results in a change of conductivity to p type in said initial region.

6. The method of claim 5, wherein heating for changing said conductivity type is distinct from heating to develop said initial spreading resistivity profile.

7. The method of claim 1, wherein step (iii) comprises at least one of plasma etching, chemical etching and chemical-mechanical polishing.

8. The method of claim 1, further comprising a step of selectively implanting dopant ions in said device region for forming channels for charge carriers.

9. The method of claim 1, further comprising a step of selectively implanting dopant ions in said device region for forming source and drain regions.

10. The method of claim 1, further comprising forming a CMOS structure in said p-type device region.

11. The method of claim 10, wherein forming said CMOS structure comprises forming a trench between NMOS and PMOS devices, to a depth of at least to said depth of said peak of said spreading resistivity of said p-type device region.

12. The method of claim 1, further comprising a step of epitaxially growing a crystalline region on said p-type device region.

13. The method of claim 1, wherein heating of said initial region is to a temperature of approximately at least 900 degrees C.

* * * * *